United States Patent [19]

Bathiany et al.

[11] 4,085,361
[45] Apr. 18, 1978

[54] MEASUREMENT OF FREQUENCY RESPONSE WITH IMPROVED SENSITIVITY AND ACCURACY

[75] Inventors: Robert H. Bathiany, San Jose; Bernhard Jensen, Mountain View, both of Calif.

[73] Assignee: Wiltron Company, Mountain View, Calif.

[21] Appl. No.: 776,233

[22] Filed: Mar. 10, 1977

[51] Int. Cl.$^2$ ............................................. G01R 27/00
[52] U.S. Cl. ................................................. 324/57 SS
[58] Field of Search ............... 324/57 SS, 57 R, 58 R, 324/58 A, 58 B; 328/162, 165

[56] References Cited

U.S. PATENT DOCUMENTS

| 3,441,843 | 4/1969 | Wainwright | 324/57 SS |
| 3,617,879 | 11/1971 | Mugnier | 324/57 R |
| 3,774,107 | 11/1973 | Dunwoodie | 324/57 R |

*Primary Examiner*—Stanley T. Krawczewicz
*Attorney, Agent, or Firm*—Limbach, Limbach & Sutton

[57] ABSTRACT

A testing system including a swept frequency signal generator to apply a signal to a device under test, a broadband detector for receiving and detecting that signal returned from the device under test, a cathode ray tube connected to display the detector output level as a function of frequency applied to the device under test after high gain low frequency amplification of the detector output signal. The detector input is provided with an input impedance across its two conductors that is matched to the impedance of the circuit under test, with a capacitor connected subsequent to the load impedance in each of the two detector leads. The detector circuit between the capacitors and an input to the high gain amplifier is unconnected to ground except at one of the amplifier input terminals, thereby to improve the accuracy and sensitivity of measurements. Any nonlinear frequency response of the detector are corrected by adding to the measured signal before display a voltage proportional to the frequency of the signal generator output. In order to reduce error from amplifier drift, the high gain amplifier is re-zeroed during the retrace of the signal generator. In order to make the cathod ray tube display more easily readable, frequency markers are superimposed upon the display signal by an electronic circuit that generates marks of varying precise widths at varying frequencies that are stacked together to provide composite marks of controllable width and discernable height.

41 Claims, 9 Drawing Figures

MEASUREMENT OF FREQUENCY RESPONSE WITH IMPROVED SENSITIVITY AND ACCURACY

BACKGROUND OF THE INVENTION

This invention relates generally to techniques for measuring the frequency response characteristics of a device such as a bandpass filter, for an example of a passive device, particularly those applications where low level signals are required to be detected and measured.

A principal application of frequency response measurements is with devices having normal use in handling signals over some bandwidth wherein it is desired to determine exactly what the frequency response characteristic of the device is. A known alternating current signal is applied to the device and its response is measured as a function of frequency of the applied test signal. The simplist means of carrying out such a measurement is to use a varying frequency output signal generator applying a controlled frequency signal to the device with a voltmeter measuring its response. Besides passive devices, active devices such as amplifiers may be tested in this way. The frequency output of the signal generator is varied and the response of the device noted by reading the voltmeter level for each of the different frequencies applied to the device as adjusted on the signal generator.

For faster testing, a swept frequency signal generator is used which repetitively generates an output signal transversing a frequency range from a first frequency to a second frequency during which the response of the device under test is measured, with a return time existing between each cycle wherein the signal generator resets to its first frequency. The output of the device under test is then displayed on an oscilloscope whose horizontal sweep is driven by the same signal generator, the retrace of the sweep occurring during the period that the signal generator resets itself from the second frequency back to the initial first frequency. If a device is being tested with high frequencies, such as in the radio frequency range of the spectrum, a detector is generally utilized at the output of the device under test convert the high frequency signal to be measured into a direct current signal level which varies in proportion to the amplitude of the high frequency signal from the device under test. If low level signals are to be measured, a low frequency amplifier is then utilized at the output of the detector to raise its output signal level to a magnitude sufficient to present a satisfactory cathode ray tube display. It is in conducting tests with low level signals wherein inaccuracies result from any non-linearities in the detector/amplifier circuitry and noise that may exist in the circuit under test that is of a significant level when compared to the low level signals being measured. A signal generator power output can be made higher to over come the signal-to-noise ratio problems in a device under test but this is undesirable when the signal level exceeds that for which the device is designed to work in actual practice since it may be overdriven or otherwise change its characteristics because of the large signal. Furthermore, signal generators having large power outputs are extremely expensive.

The detector normally utilized is of a broadband type; that is, it accepts and detects any frequency within the range of the signal generator without any tuning. A different type of detector that is sometimes utilized, but which is generally undesirable because of its complexity, high cost and slow response time, is a narrow band detector utilizing a frequency selective receiver that is tunable in synchronism with the signal generator. Such a detector has the advantage, however, of significantly suppressing noise and interferring signals outside the test frequency range of interest while a broadband detector will not so discriminate. The most common broadband detector elements are semiconductor diodes, thermistors or barretters. The most usual noise and interferring signals include direct current and power line induced frequencies of 60 Hz and several harmonics thereof. The term "noise" as used herein is meant to include these undesired signals.

The sensitivity of existing measuring circuits utilizing a broadband detector followed by a high gain, low frequency amplifier results principally from undesired noise present in the output of the device under test which is large compared with the signal to be measured and displayed. The noise is usually within the bandwidth of a detector and amplifier. Non-linearity of the detector response as a function of frequency, and noise contributions and drift of the high gain amplifier, also contribute to a limit on the sensitivity of such devices.

One approach to overcome these difficulties and increase the sensitivity of such measuring devices has been to include capacitive coupling in each of two leads of the detector input to isolate the detector from direct current and low frequency noise of the device under test. However, such devices utilize the detector input capacitors as part of the input loading impedance of the device under test. The reactances of these capacitors are not optimized to maximize the signal-to-noise ratio so long as they must be selected for proper loading of the device under test. Proper impedance matching with the device under test becomes more critical as the test frequency increases because of the generation of standing waves. Also, the value of the capacitive isolation of the detector is not fully realized because of the grounding that is used in the detector and high gain amplifier circuit.

Another approach to increase the sensitivity of such measuring instruments that is presently commercially available is to modulate the signal generator output at a frequency somewhere inbetween the frequency of the undesired noise and the signal detector output frequency. After detection and amplification of the signal received back from the device under test, this signal is synchronously demodulated and then applied to the cathode ray tube for display. This technique has the advantage of rejecting undesired noise and minimizing errors from drift of the detector amplifier circuits and noise introduced therein. However, this technique has a serious disadvantage that the device under test may not respond in the same way to the modulated signal generator output as it does to a continuous signal.

Another, but related, technique that is presently available in commercial instruments is to apply alternating current modulation and demodulation around only the high gain amplifier which removes the principal problem of the technique described in the prior paragraph since the device itself is not subjected to a modulated waveform. But this technique suffers from the disadvantage that such a circuit becomes susceptible to the interferring signals present at the amplifier input. Both this and the technique described in the prior paragraph suffer from a further disadvantage that they are slow in response, and further both techniques are very expensive to commercially implement.

Therefore, it is a principal object of the present invention to provide a method and circuit implementation thereof for improving the sensitivity of a detector/amplifier combination in device testing apparatus without the aforementioned disadvantages that now exist with present techniques. It is also desired to do this in a manner that is less complex and less expensive than the techniques of the prior art described above.

It is a further object of the present invention to provide an improved technique for compensating for non-linear frequency varying characteristics of broadband detectors and for correcting for drift in high gain low frequency amplifiers.

It is yet another object of the present invention to provide an improved technique of superimposing various frequency markers on a signal displayed on a cathode ray tube for more rapid and sure identification of the frequency points along the display.

SUMMARY OF THE INVENTION

These and additional objects of the present invention are accomplished, briefly, by an instrument that provides a swept frequency signal generator for applying an unmodulated alternating current signal of varying frequency to a device under test, a broadband detector receiving a signal from the device followed by a low frequency high gain amplifier, wherein the input to the detector includes an initial load impedance matching the device impedance to which the detector is connected and a pair of reactances connected on either side of the load impedance in each of the two lines to the detector. The reactances are chosen in value to have a much lower impedance to the frequency range of the signal generator being employed than to any undesired noise that lies in a different frequency range from that of the signal generator.

Since the most common problem is interference from direct current and power line frequencies, including harmonics, these reactances are generally capacitors chosen to have a low impedance to the frequency range of the signal generator. Since the load impedance, usually a resistance, precedes the capacitors, the capacitors need not be valued to match the detector impedance to that of the device under test. The value of the capacitances can then be maximized for the desired noise suppression and isolation. One side of the input circuit to the detector in advance of the load resistor is connected to chassis ground, as standard safety procedures demand. But the capacitor in that lead breaks that ground connection to isolate the detector from any undesired ground currents. To maximize this advantage, a ground is utilized in the detector circuit prior to the input terminals of the high gain amplifier only at one of the terminals of the amplifier through a path that is independent of any of the detector circuits or conductors. Although reactances in the forms of capacitors are illustrated in the application wherein the noise is in a frequency spectrum that is less than the frequency range under which the device is being tested, inductors would be utilized if the noise was in a frequency spectrum that was higher than the frequency range of the signal generator.

According to additional aspects of the present invention, the sensitivity and accuracy of the measuring circuits are further increased by the novel way of compensating for non-linear frequency response of a broadband detector, usually a semiconductor diode, and for correcting for any drift in the high gain amplifier. The diode non-linearity is corrected for by adding to the output of the amplifier a signal from the signal generator that has a voltage level proportional to the frequency output at any instances of the signal generator. This is particularly advantageous when the signal has been converted into decibels such as by making the amplifier a logarithmic one. The drift of the high gain amplifier is corrected by re-zeroing the amplifier during the time that the signal generator resets to its initial frequency, as commanded by an appropriate pulse from the signal generator itself.

According to another aspect of the invention, an improved circuit is provided, preferably as part of the signal generator, for superimposing frequency markers on the signal output that is displayed on the cathode ray tube. A pulse of a controlled height and carefully controlled width is generated at given frequency intervals of the signal generator output. Similar pulses, but with narrower widths, are generated at frequent intervals that are a fraction of the wider pulse intervals. If desired, additional pulses can be generated at more frequent intervals, the more frequent pulses being narrower than the less frequent ones. The outputs of each of such pulse generators are amplitude combined and applied to the cathode ray tube, resulting in adding pulses at the less frequent frequency intervals to show higher marks at those intervals. Distinguishing lower marks appear on the cathode ray tube at the more frequent frequency intervals. The widths of each of the pulses are controllable by a single control that adjusts all the widths proportionally in order to avoid distortion of the mark shape on the cathode ray tube when its width is altered.

The cathode ray tube display, circuits therefor, signal generator, marker circuits and high gain amplifier circuits are all preferably provided as part of a single instrument within a single instrument case. The result of a highly convenient measuring instrument that is self contained and has included therein all of the interconnections of the various pieces referred to above.

Additional objects and advantages of the various aspects of the present invention are included in the following description of a preferred embodiment of an instrument utilizing the various invention aspects, which description should be taken in conjunction with the accompanying drawings.

DESCRIPTION OF A PREFERRED EMBODIMENT

Various aspects of the present invention will be described in the form commercially embodied in an instrument sold by the Wiltron Company of Palo Alto, Calif., assignee of the present application. This instrument front panel is illustrated generally in FIG. 1. An instrument case 11 includes a permanently installed cathode ray tube 13 having its screen placed in the front of the instrument. Along side the screen is a CRT control panel 15 with appropriate driving circuits therebehind. Removably inserted into the lower portion of the instrument case 11 is a signal generator section 17, a return loss measurement section 19 and a transmission loss measurement section 21. A device under test 23 is also illustrated. Two traces are illustrated on the face of the CRT 13, one is a result of the return loss measurement of the device under test 23 conducted by the module 19 and the other the result of the transmission loss measurement of the device under test 23 as measured by the transmission loss module 21. The units in the horizontal direction of the CRT display is in frequency and the units in the vertical direction is in decibels, in the particular instrument example being described.

Figure 1:
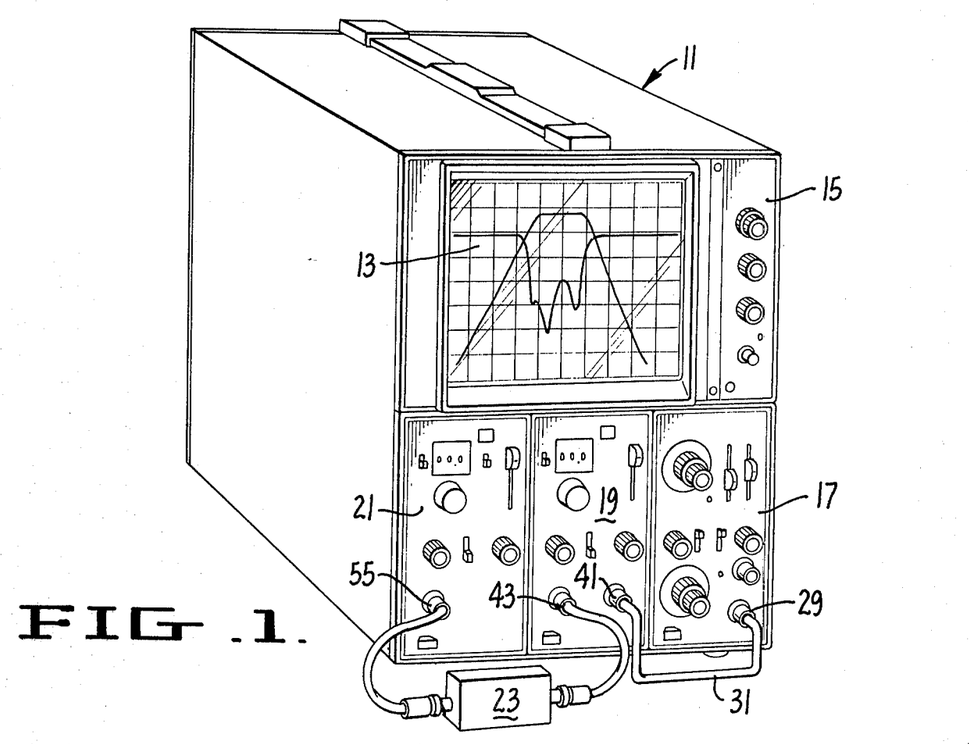
FIG. 1 shows an instrument utilizing the various aspects of the present invention.
Figure 2:
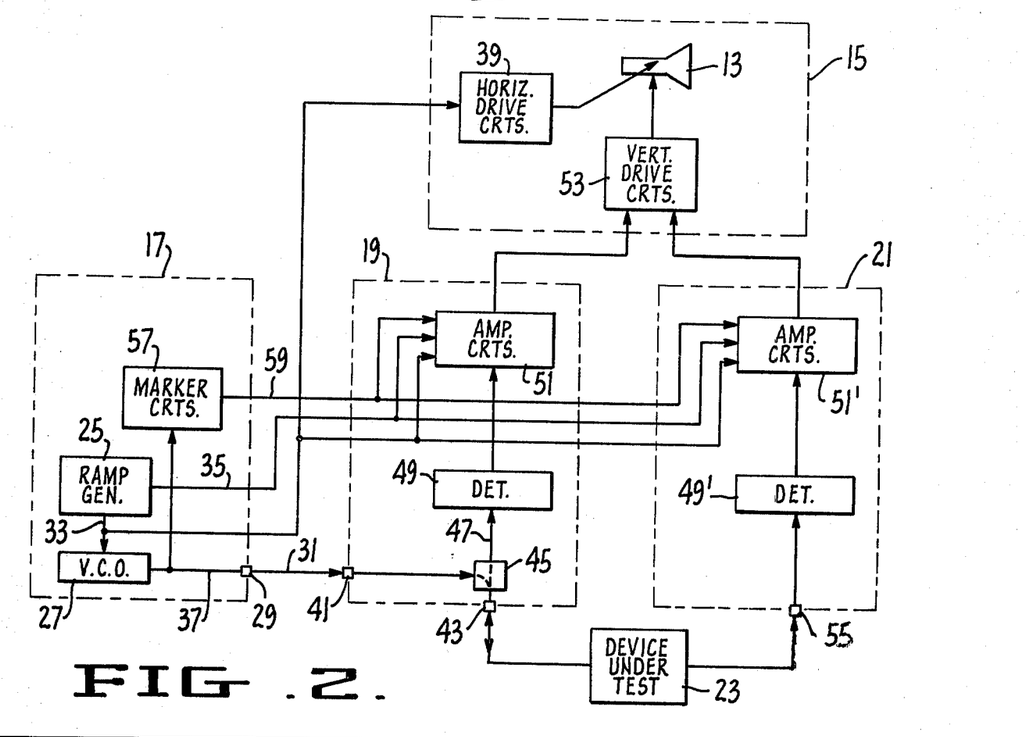
FIG. 2 shows in general block diagram form, the major electronic components of the instrument of FIG. 1.
Figure 3:
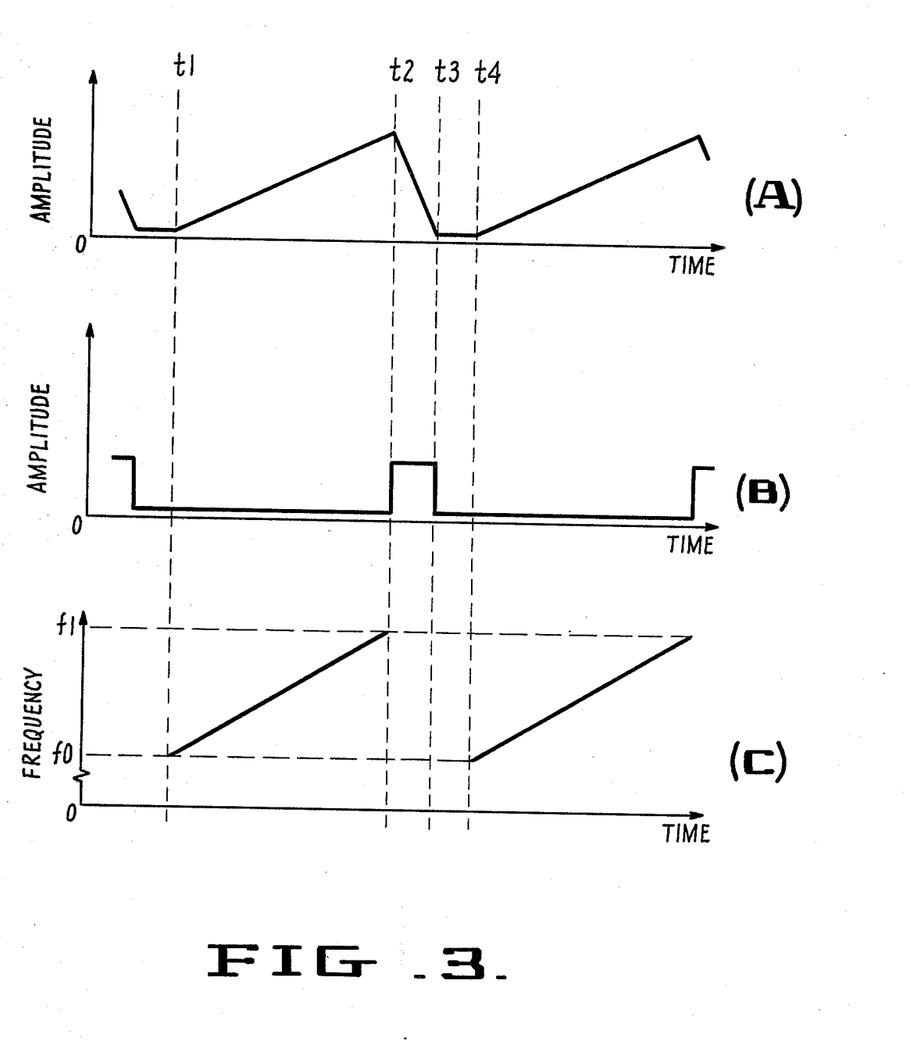
FIG. 3 shows certain signal waveforms occurring in the circuit illustrated in FIG. 2.

The major components of the instrument of FIG. 1 are also illustrated in the schematic block diagram of FIG. 2 wherein the same reference numbers refer to the same elements. The signal generator block 17 is shown in dotted outline to include as its major components a ramp generator 25 and a voltage controlled oscillator 27. An output of the voltage controlled oscillator is provided at a panel connector 29 to which a coaxial cable 31 is connected at one end. The ramp generator 25 and voltage controlled oscillator 27 are of known types having characteristics as illustrated in FIG. 3. FIG. 3A shows the voltage output of the ramp generator at a line 33 (FIG. 2) as a function of time. Between the times $t1$ and $t2$, the voltage is increasing at a linear rate. Between the times $t2$ and $t3$, the voltage is usually decreasing at a much sharper linear rate. Between the times of $t3$ and $t4$, the voltage output of the ramp generator 25 is substantially zero. At the time $t4$, the output begins the same cycle that was previously begun at time $t1$. A second output 35 of the ramp generator 25 (FIG. 2) generates a rectangular pulse as illustrated in FIG. 3B between the times $t2$ and $t3$. That is, a pulse is emitted during the decreasing or return time of the ramp generator output.

The output of the voltage controlled oscillator 27 at a line 37 (FIG. 2) is illustrated in FIG. 3C. During the time that the ramp generator output of FIG. 3A is linearly increasing, so the frequency in the line 37 is linearly increasing. The ramp generator 25 so controls the voltage controlled oscillator 27. At time $t1$, the oscillator output is at a beginning frequency $f0$ and at time $t2$ at a frequency $f1$. In between these extremes, the frequency increases at a linear rate. During the time that the oscillator resets itself from its ending frequency $f1$ to its initial frequency $f0$ to start the cycle over again, the oscillator may be disabled and emit no signal, as is the case shown in FIG. 3C, or could emit an output having a frequency variation following the shape of the output voltage of the controlling ramp generator 25 as shown in FIG. 3A. For the embodiment herein, the oscillator 27 emits frequencies within the radio frequency portion of the spectrum, defined for the purposes of this description to be between about 100 KHz and 60 GHz. For the specific example, the lower frequency $f0$ is 1 MHz and the higher frequency $f1$ is 1500 MHz.

Referring again to FIG. 2, the voltage ramp signal output in line 33 of the ramp generator 25 is also applied by internal wiring between modules to horizontal CRT drive circuits 39 within the CRT device 15. The electronic beam is thus driven in a horizontal direction in synchronism with the sweep of the frequency being applied to the device under test 23 through the oscillator output panel connector 29. During the times $t1$ through $t2$ as shown in FIG. 3A, the electron beam sweeps in one direction to cross the face of the CRT 13 to trace out the desired signal display. During the times $t2$ to $t3$, the electron beam is retraced in the opposite direction to begin again.

The return loss module 19 includes a panel connector 41 to which the signal generator supply cable 31 is attached and another panel connector 43 to which one end of the device under test 23 is attached. Within the module 19, the signal source passes through a directional circuit 45 and to the device under test 23. Any reflected energy comes back through the hybrid 45 and a circuit 47 to a detector 49 and thence to amplifying and signal processing circuits 51. The output of amplifying circuit 51 is internally wired to the CRT block 15 and applied to vertical drive circuitry 53 as one input. The circuits 53 drive the electron beam in the vertical direction in accordance with the level of the reflected signal from the device under test 23.

The transmission loss measuring module 21 includes a panel connector 55 to which an opposite end of the device under test 23 is attached. The portion of the signal generator output that passes completely through the device under test 23 is thus presented to the module 21 at its panel connector 55. That signal is applied to a detector 49' and thence to an amplifying and signal processing circuit 51', given the same reference character with a prime (') added as in the case of the module 19 since the circuits are essentially the same. The output of the amplifier circuit 51' is applied to the second input to the vertical drive circuits 53. The circuits 53 apply both of its inputs to the cathode ray tube in a manner to simultaneously trace both signals.

Within the signal generating module 17 is a circuit 57 for generating frequency markers in an output line 59 which is applied to the amplifier and signal processing circuits 51 and 51' in a manner to superimpose the markers on the waveforms to be displayed. These markers are generated in synchronism with the output in the line 37 of the oscillator by connection thereto. The amplifying and processing circuits 51 and 51' also each receive the pulse of FIG. 3B in line 37 and the ramp signal of FIG. 3A in line 33. These latter mentioned inner connections are all permanently provided for within the instrument case 11 as part of the electrical communication between the plug-in modules.

Having plug-in modules 17, 19 and 21 provides a great deal of flexibility in a basic system by providing modules having varying characteristics. One of these varying characteristics can be the frequency range at which the signal generator module 17 operates and to which the receiving modules 19 and 21 are designed to respond. Different modules can be provided for testing different devices 23 having different impedances. The most common impedances of devices tested in the radio frequency are 50 to 75 ohms. Various receiving modules 19 and 21 can be provided having different detector characteristics, such as one type with a logarithmic detector and another type with a linear detector. Additionally, the detectors 49 and 49' and the directional circuit 45 can be provided in alternate receiving modules 19 and 21 outside of the instrument itself, this variation providing for placing the detectors outside of the instrument very close to the device under test. These are among the few of many variations in the circuit modules that are possible with the plug-in module technique which would employ the same internal wiring connections between the various modules.

Figure 4:
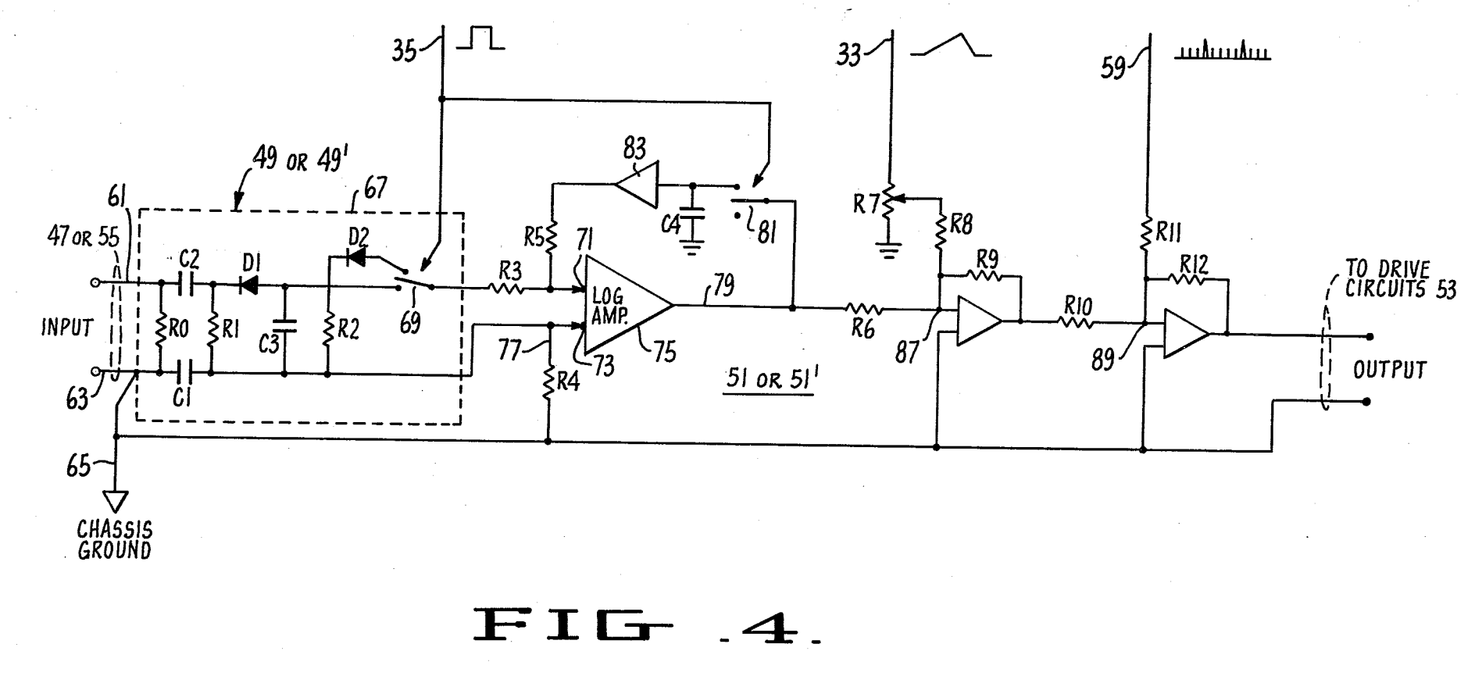
FIG. 4 is a detailed schematic diagram of the detector and amplifier circuits of the circuit illustrated in FIG. 2.

Referring to FIG. 4, an electrical component schematic diagram of the detector and amplifying and signal processing circuits of the modules 19 and 21 of FIG. 2 is illustrated. Since these circuits are essentially the same whether return loss or transmission loss is being measured, the common aspects of these circuits are described with respect to FIG. 4. The detector circuit 49 or 49' receives a low level signal within the frequency range $f0 - f1$ plus undesired noise in a different frequency spectrum in its input lines 61 and 63. The illustrated conductors 61 and 63 may be in the form of wires as shown in FIG. 4, or more generally for all frequency ranges may be referred to as a port having sides 61 and 63. The goal of the detector and amplifying circuits is to extract the desired signal from the undesired noise across the conductors 61 and 63.

An input terminating impedance R0 is provided directly across the lines 61 and 63. This impedance is selected to have a value that matches as nearly as possible the impedance of the device under test so that any aberrations in the measurements that result from an impedance mismatch will be minimized. For radio frequency applications, R0 is generally 50 or 75 ohms depending upon whether the device is being tested at a port impedance of 50 or 75 ohms, respectively. Since the impedance usually has no imaginary component, the terminating impedance R0 is a simple resistance. The remaining circuits connected across the resistance R0 are made to have an impedance that is many times that of R0 so that the voltages thereacross may be detected and subsequently amplified without those circuits affecting the input termination impedance to any significant degree.

For safety reasons, it is standard that the chassis of an instrument such as the one being described is connected to an earth ground. The earth ground, or chassis ground, is then the level to which other voltages in the circuits are referenced. However, because the various ground paths have certain resistances or other forms of impedance, ground currents can generate voltage drops between grounding points and these voltage drops can be displayed as part of the desired signal if proper precautions are not taken. This is especially a problem since one of the sides or lines 63 of the input to the detector is connected to a chassis ground 65. Because the detector 49 or 49' is dealing with very low level signals, that detector circuit is also enclosed in a grounded shield 67. But this ground circuit is broken within the detector circuit itself by use of a capacitance C1 placed in the path of the line 63. It is more normal to have a capacitor C2 in the non-grounded line 61 in such circuits and to omit the capacitance C1. But the capacitance C1 breaks a ground path that carries direct current levels and induced power line frequencies and several harmonics thereof, the most prevalent form of undesired noise in such measuring instruments.

The values of the capacitances C1 and C2 are made to be as close to the same as possible and are chosen so that their impedance to the flow of current between the signal generator output frequencies of $f0$ to $f1$ is very low compared to the impedance to the frequency range in which the undesired interferring signals most commonly fall, such as those below 1000 Hz down to and including direct current. A resistance R1 connected across the opposite sides of the capacitor C1 and C2 to those sides that are connected across the input resistance R0 is made to be at least several times larger than the resistance R0 so that it does not significantly affect the input impedance that a device under test sees when it is connected to the lines 61 and 63. A semiconductor diode D1 is connected in the path of the line 61 on the opposite side of the capacitor C2 from the input. The resistance R1 provides a direct current return for the diode D1. A capacitance C3 connected on the opposite side of the diode D1 and to the side of the capacitance C1 opposite to its connection with the input line 63 is provided to smooth out the rectified alternating current input signal across the input resistance R0. This rectified and smooth signal is then applied through a switch 69 in one line and a series resistance R3 to input terminals 71 and 73 of a very high gain amplifier 75. The amplifier 75 is required because of the low level of the signal that is to be monitored. Because of the low level of the signal it is extremely important that the noise, which may be as much or perhaps more in magnitude than the desired signal, be suppressed. Such suppression is accomplished by the circuitry being described.

The amplifier 75 needs to be referenced to ground potential and since the capacitor C1 has been introduced to break the normal ground connection, a ground path 77 having a resistance R4 therein is provided between the input terminal 73 and the chassis ground 65. The resistance R4 is typically a low value, particularly with respect to the input impedance of the following stage, and may take the form of a simple conductor. The resistance R4 is provided in accordance with standard techniques utilizing high gain amplifiers such as the amplifier 75.

By breaking the grounded side 63 of the input circuit and then regrounding it at the high gain amplifier input, ground currents are prevented from flowing in the detector circuits in a manner that would cause any resulting voltage drops to be amplified by the amplifier 75. The amplifier 75, being of a low frequency or direct current type, is very sensitive to any direct current or low frequency variations that might occur in one side 63 of the detector circuit but not the other. But it will be noted by reference to FIG. 4 that there is no ground path between the capacitor C1 and the amplifier input 71 through which such currents flow so the potential noise voltages that can be set up thereby are eliminated. No other point in the detection circuits between the capacitor C1 and C2 and the input terminal 71 and 73 of the amplifier 75 is connected to chassis ground. The capacitance C1 is chosen to have a value so that its impedance at the range in which the undesired noise occurs is many times higher than the impedance between the line 63 and the chassis ground 65, thus shunting any undesired ground currents developed in earlier portions of the circuitry to ground rather than passing them on through the detector to the amplifier 75.

An output 79 of the amplifier 75 generates, with respect to chassis ground, an amplified version of the detected signal that exists between the frequencies $f0$ and $f1$. Once this initial high gain amplifier is employed, the remaining circuitry is not so critical. Normal coupling and grounding techniques are quite satisfactory. The signal level at the output of the amplifier 75 is high enough with respect to any further noise that can be introduced to make it unnecessary to take the precautions described for the circuits prior to the input of the amplifier 75. In this example, the amplifier 75 is made to have a logarithmic transfer function so that the CRT display is in decibels. Of course, linear amplifiers may also be used and even other indicators than a CRT may be used to give desired response characteristics of the device under test.

The provision of carefully designed ground return paths aids to the minimization of direct current drift within the amplifier 75, as well as utilizing low temperature co-efficient devices and constant power dissipation. But any remaining small potential drift of the amplifier 75 over time is automatically corrected during each retrace time $t2 - t3$ (FIG. 3) of the signal generator. This is accomplished by providing a feedback loop around the amplifier 75 (FIG. 4) which includes a switch 81, a capacitance C4 connected between the return path and ground potential, an amplifier 83 and a series resistance R5. Through this path, when the switch 81 is in its appropriate position, the amplifier output in line 78 is fed back to the input terminal 71 and causes a voltage to be impressed upon and stored in the capacitor C4 after the switch 81 is disengaged. The voltage and capacitor C4 provides a bias that is then added to the incoming signal at the amplifier input terminal 71 to correct for any internal drift in the amplifier. Operation of the switch 81 is accomplished by connection to the line 35 from the ramp generator 25 within the signal generator module. This results in closing the switch 81 at the occurrance of each of the pulses shown in FIG. 3B.

As noted from FIG. 3C, the signal generator in this particular example has its output turned off during the retrace and quiet period between the times $t2$ and $t4$. Therefore, during the time that the switch 81 is closed to re-zero the amplifier 75, there is no signal being applied to the device under test and thus no signal from that device entering the port 47 or 55 of FIG. 4. Of course, the amplifier 75 should have its signal and noise input removed during the time that it is re-zeroed and the turning off of the signal generator output accomplishes this to a degree. But the potential existence of noise, even though a small amount, and in order to provide additional flexibility in the circuit of FIG. 4 so that it can be used even with a signal generator that does not turn off during the retrace interval, the switch 69 is provided in one of the input leads to the amplifier 75 to switch from the input port 47 or 55 to an alternate circuit.

This alternate circuit is formed of diode D2 and resistance R2 in series, connected across the amplifier input. The characteristics of the diode D2 and resistance R2 are selected so that the amplifier, during the period that they are switched across its input, sees the same impedance and other characteristics as it does when the switch 69 connects the amplifier input to the actual detector circuit of D1. In fact, the diode D2 can be replaced with other circuit elements having substantially the same impedance characteristics as a diode with no input. The alternate circuit will typically be positioned to share the same thermal environment as the detector D1. The switch 69, as shown in FIG. 4, is controlled from the retrace pulse in the line 35 in synchronism with the switching of the switch 81. That is, when the feedback loop around the amplifier 75 is switched into the circuit by closing the switch 81, the switch 69 is simultaneously moved to a position where the alternate or "dummy" detector circuit D2 and R2 are connected across the amplifier input.

With continuing reference principally to FIG. 4, the amplifier output line 79 contains a signal which could be applied to some indicating means, preferably the CRT 13 of the particular measuring system being described as an example. But to improve accuracy, sensitivity and to make it more convenient for reading a cathode ray tube display, signals in the lines 33 and 59 are combined with the amplifier output in the line 79 at summing junctions 87 and 89, respectively, according to well known circuit techniques. The signal in the line 33 as shown in FIG. 3A is a voltage proportional to frequency output of the signal generator and a portion of that voltage as selected by the variable resistance R7 is combined with the amplifier output signal in the line 79 in order to compensate for frequency dependent non-linear characteristics in the system. Various lengths of coaxial cable applied to the front panel of the instrument to the device under test, as an example, will have various amplitude-frequency characteristics which can be taken into account by the operator in properly adjusting the variable resistance R7.

Figure 5:
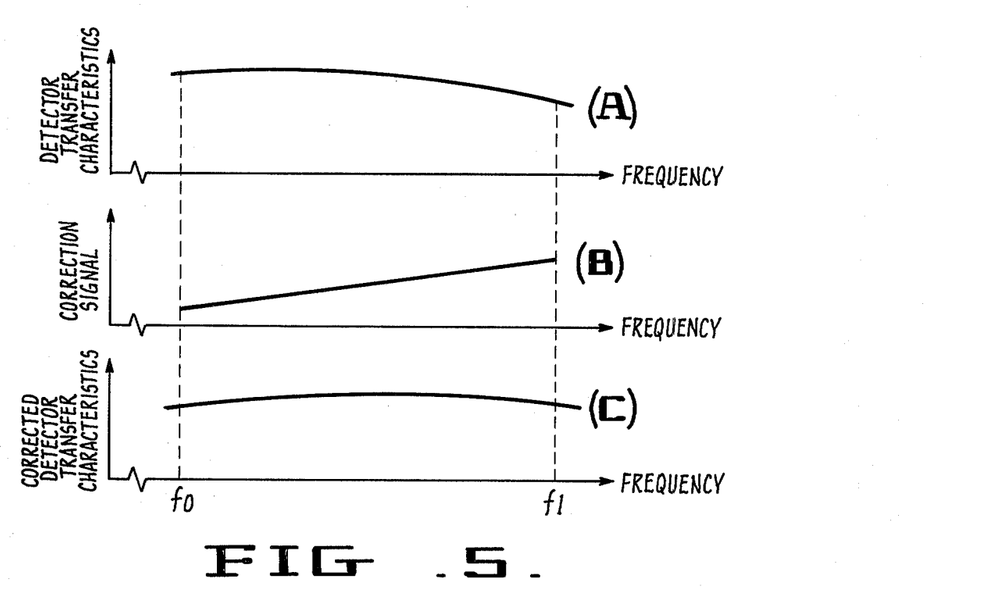
FIG. 5 shows several waveforms at various points in the circuit diagram of FIG. 4.

But the principal non-linear component in the system is the detector diode D1 which will typically have an amplitude transfer function as shown in FIG. 5A as a function of frequency of the signal being applied to it. As seen from FIG. 5A, the output voltage of the diode D1 is flat for a portion between the signal generator frequencies $f0$ and $f1$ but then drops as the frequency increases to the higher limit $f1$. At the summing junction 87 of FIG. 4, a signal that is linear with respect to frequency, as shown in FIG. 5B, is added thereto from the line 33 which results in a summed signal which will look like that shown in FIG. 5C. It will be noted that the effective transfer characteristics of the diode after this compensation as shown in FIG. 5C is much flatter over the frequency range at which the instrument is operating than is the diode alone without such compensation as shown in FIG. 5A. Of course, more complicated shaping of the additive waveform of FIG. 5B could be accomplished in known ways but it has been found that merely adding the signal in the line 33 as shown in FIG. 5B to the signal being measured is quite adequate.

Figure 6:
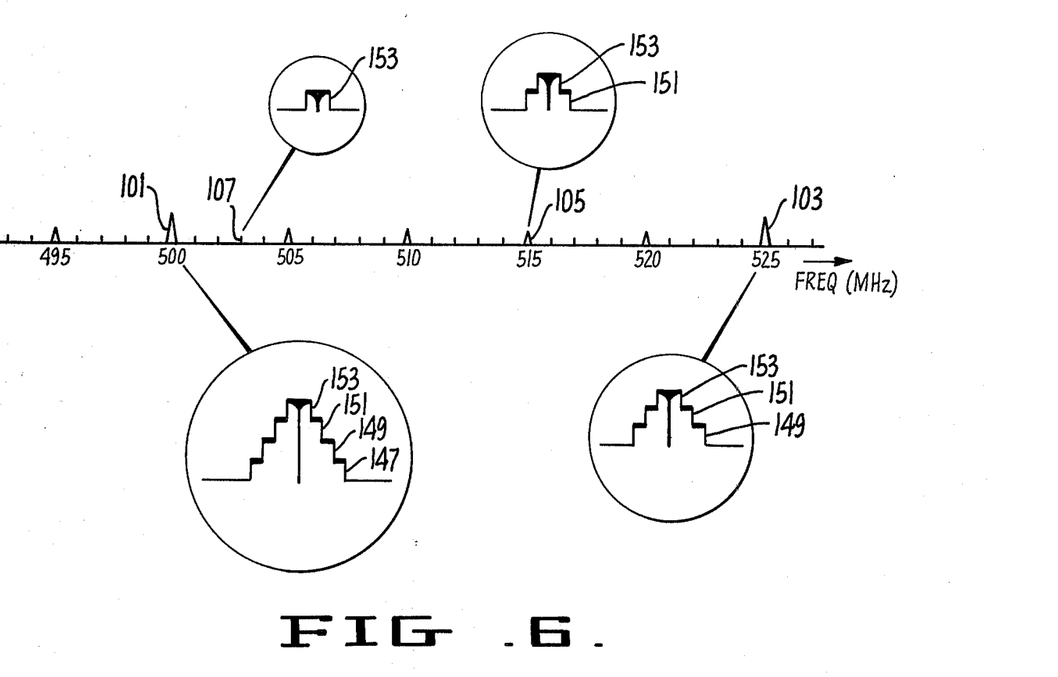
FIG. 6 illustrates the output of a frequency marker circuit illustrated generally in FIG. 2.

The signal in the line 59 that is then combined at the summing junction 89 with the signal after correction but before display on the CRT is a marking signal which displays a series of marks in the form illustrated in FIG. 6. In the example described herein, marks having four different heights are generated, the heights being an indication of the frequency interval of that particular mark. Referring to FIG. 6, a largest mark 101 of the marks occurs with the least frequency, at every 100 MHz for the particular system being described. That is, the largest mark will occur on the screen of the CRT to indicate that the frequency at that mark is 500 or 600 to 700, etc., MHz. The next larger mark, an example being the mark 103 shown in FIG. 6, occurs in the specific example, at 25 MHz intervals between the upper marks 101. That is, the marks of the type of 103 occur four times more frequently than the larger marks of the type 101.

The next smaller mark, such as the mark 105 of FIG. 6, occurs, in the particular example, every 5 MHz on the CRT display which is five times more frequently than the mark 103 or 20 times more frequently than the highest mark 101. The most frequent mark is the smallest one, an example being the mark 107. This smallest mark occurs each 1 MHz across the display which is five times more frequent than the next highest mark 105 and 100 times more frequent than the highest mark 101. The detailed shaped of each of these marks is also shown in FIG. 6 by way of example in magnified versions thereof. Although four different types of frequency markers are illustrated having four distinct frequency intervals, any number of two or more marks having varying heights may be utilized according to the particular application. The marks as shown in FIG. 6 are generated and controlled by the circuitry illustrated in FIGS. 7 and 8.

Figure 7:
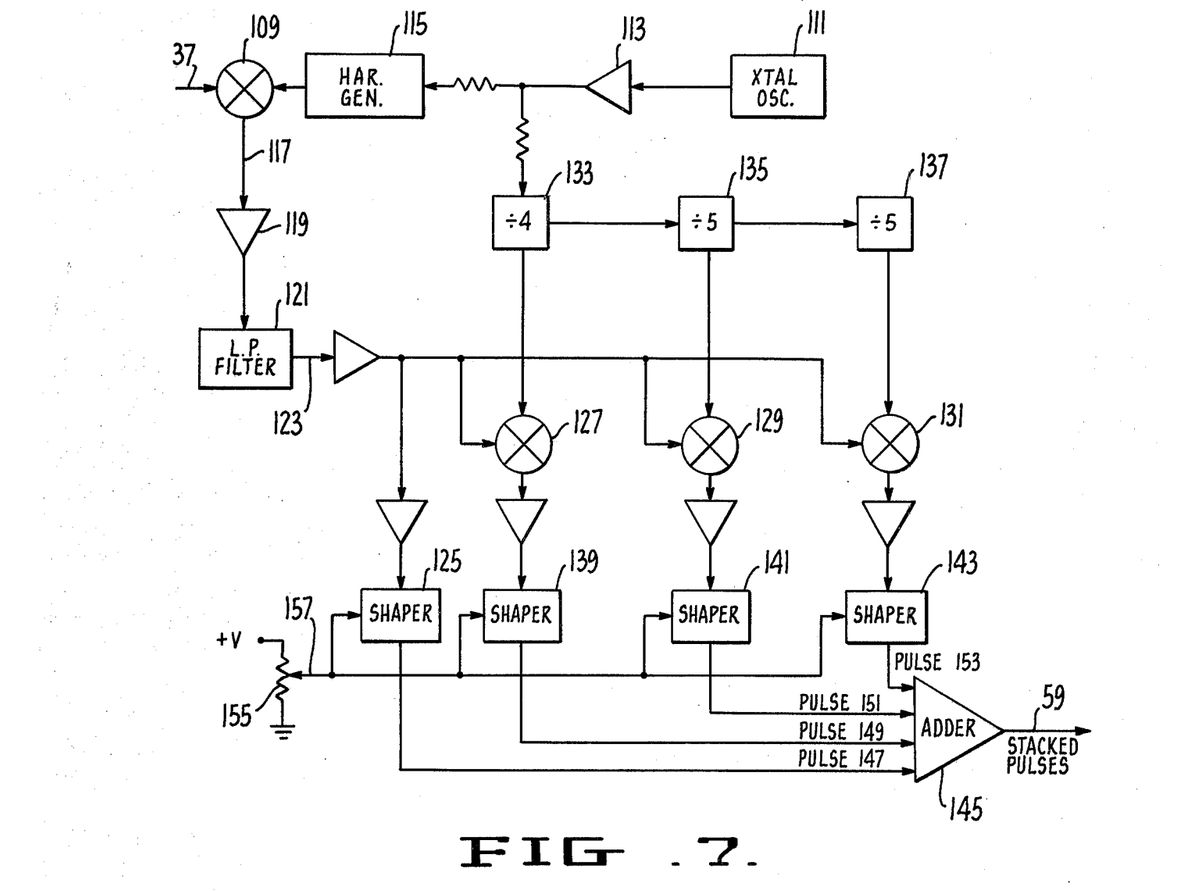
FIG. 7 is a more detailed block circuit diagram of the marker circuit of FIG. 2.

Referring initially to FIG. 7, the oscillator output signal 37 is applied to a mixer circuit 109. A second input to the mixer 109 is developed from a crystal oscillator 111 whose output is amplified by an amplifier 113 and then passed through a harmonic generator 115 before being applied to the mixer 109. The result at an output 117 of the mixer 109 is a signal that is the sum of difference of the oscillator output in the line 37 and that of the fundamental frequency of the crystal oscillator 111 and its harmonics. The output 117 is constantly changing since the frequency of the oscillator in the line 37 is constantly being swept from one frequency to another. In a particular instrument example, the oscillator 111 is chosen to have a frequency of 100 MHz. This output is amplified by an amplifier 119 and then passed through a low pass filter 121 which is selected to reject the sum and difference signal outputs of the mixer 109 that are in excess of a given frequency, that frequency being 50 MHz in this particular example. The result is a "birdie" signal in an output line 123 of the filter 121 that occurs repetitively every 100 MHz and has a shape as partially illustrated in FIG. 9A. A zero beat frequency of the waveform is that where the oscillator output frequency in the line 37 is equal to either the fundamental frequency of the oscillator 111 or some harmonic thereof. As shown in FIG. 9A, the "birdie" signal in the line 123 is of direct current at the zero beat frequency. But as the frequency of the signal generator output in the line 37 moves away from that zero beat frequency, the difference frequency increases from essentially a DC to some high frequency up to 50 MHz on either side thereof as limited by the low pass filter 121 characteristics.

Referring again to FIG. 7, the output in the line 123, after amplification, is applied directly to a shaper circuit 125 and also to mixers 127, 129 and 131. A second input of each of the mixers 127, 129 and 131 is obtained from the crystal oscillator 111 through divider circuits 133, 135 and 137, respectively. The outputs of the mixers 127, 129 and 131 are applied, after amplification, to their individual pulse shaper circuits 139, 141 and 143, respectively. The individual pulse shaper circuit outputs are each applied to an adder circuit 145 whose output in a line 59 is the marker signal that is combined with the video signal to be displayed in a manner previously described with respect to FIG. 4.

The output of the shaper 125 is a pulse 147 that is shown in FIG. 6 to form the base of the highest pulse 101. This pulse occurs each 100 MHz. The output of the shaper 139 is a pulse 149 which contributes to one layer of the additive pulses 101 and 103 as shown in FIG. 6. Because of the divider circuit 133, the pulse output of the shaper 139 occurs four times as frequently as the pulse 147 output of the shaper 125, since the divider 133 divides the frequency of the oscillator 111 by four. Since the pulses from each of the shapers 125 and 139 are based upon the same crystal oscillator 111 and sweep frequency in the line 37, and since they are of direct current, the pulses 147 and 149 are coincident and stackable.

Similarly, the pulse output of the shaper 141 is a pulse 151 that contributes to each of three of the four types of pulses illustrated in FIG. 6. The frequency of occurrance of the pulses 151 is controlled principally by the divide-by-five circuit 135. Similarly, the output of the fourth shaper circuit 143 is a pulse 153 that is most frequent and forms a part of each of the marks as shown in FIG. 6. Each of the pulse outputs of the shapers 125, 139, 141 and 143 are combined to result in amplitude stacking the pulses in a manner shown in FIG. 6 by the adder circuit 145.

It will be noticed from FIG. 6 that each of the pulse shaper outputs develop pulses of substantially the same amplitude but with varying pulse durations. This gives the appearance of a triangularly shaped pulse, as illustrated. It is often desirable to vary the width of the pulse, usually as the frequency scale on the CRT is changed by operator adjustment. That is, if the CRT horizontal sweep is adjusted for displaying a large frequency range, it is desired to adjust the pulses to have a wide width. If the sweep is made to be more narrow, on the other hand, thus giving a magnified display of a small frequency range, the pulses are desired to be made narrower so that they may be observed on the CRT trace. Therefore, a panel controlled potentiometer 155 (FIG. 7) is provided so that an adjustable voltage is applied through a line 157 to each of the shaper circuits 125, 139, 141 and 143. The goal of a single control is to adjust each of the pulse shaper output pulse widths by a proportional amount so that the triangularly appearing pulse shape does not change proportionally as its width is changed.

Figure 8:
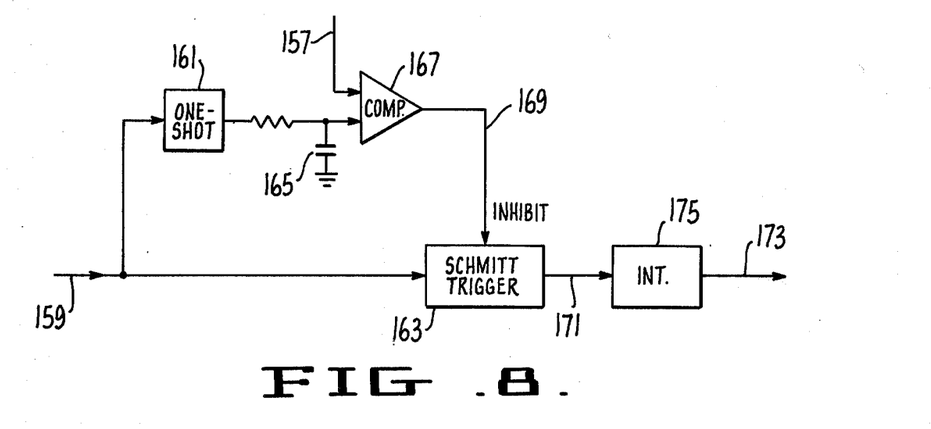
FIG. 8 is a circuit diagram illustrative of each of the shaper circuits of FIG. 7.

An important part of the circuit of FIG. 7 is the pulse shaper and an exemplary detailed circuit thereof is shown in FIG. 8. An input "birdie" signal, of the form of FIG. 9A, appears at an input line 159 to a particular pulse shaper. The input to each of the pulse shapers 125, 139, 141 and 143 is a signal of the same form as shown in FIG. 9A but proportionately changed in frequency according to the frequency dividers 133, 135 and 137. However, a common description of the pulse shapers will be made with respect to a single circuit diagram of FIG. 8.

The input "birdie" signal is simultaneously applied to a one-shot multivibrator 161 and to a Schmidt trigger circuit 163. The purpose of the one-shot 161, a capacitor 165 connected between its output and ground, and a comparator 167 comparing the voltage across the capacitor 165 with the voltage set by the pulse width control signal in the line 157, is to develop in a line 169 a signal that controllably inhibits the Schmidt trigger 163 from generating an output in its line 171. It is that inhibit circuitry that controls the width of the pulse output in a line 173 from an integrator circuit 175 that receives the Schmidt trigger output.

Figure 9:
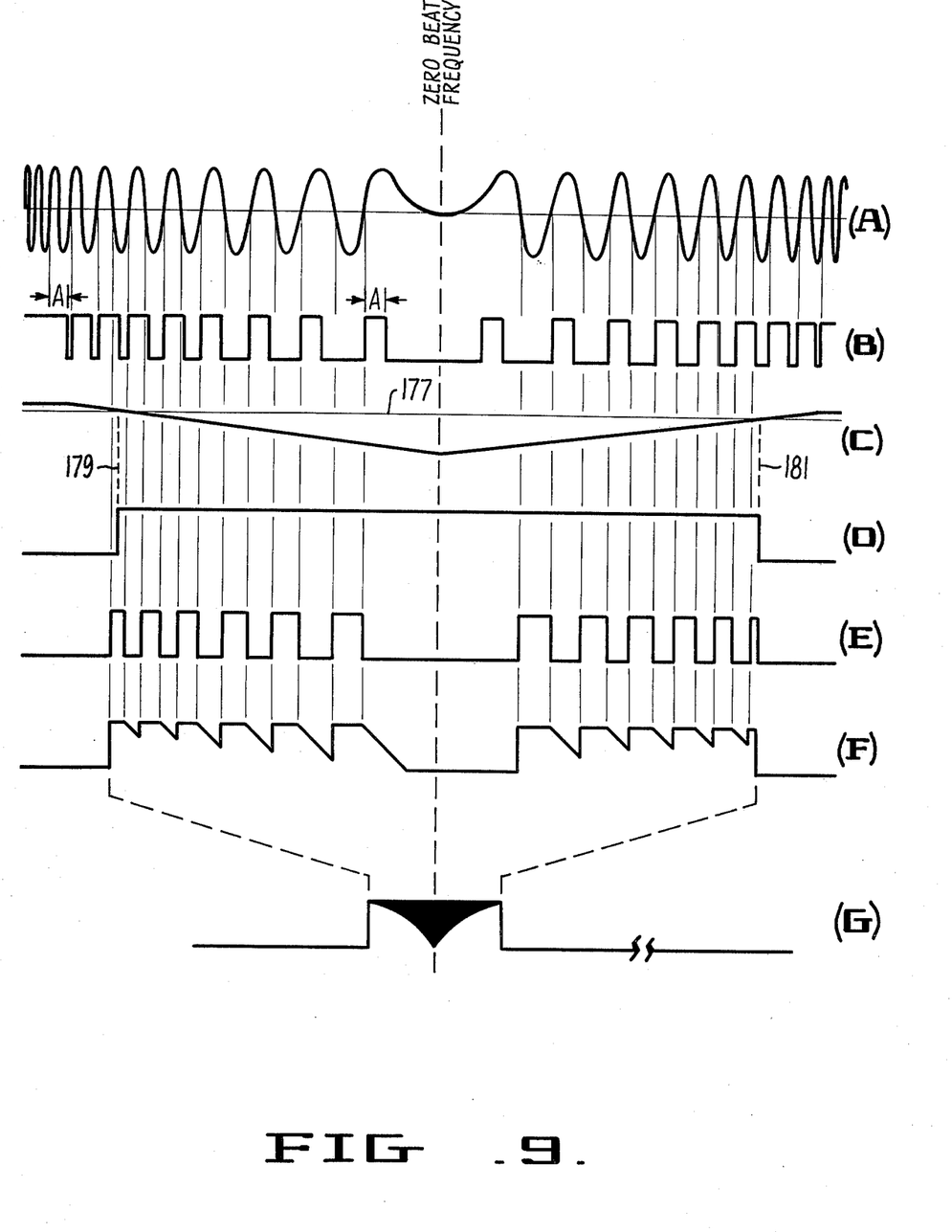
FIG. 9 shows, for illustration, several waveforms in the shaper circuit of FIG. 8.

The operation of the pulse shaper of FIG. 8 is best understood by referring to the waveforms at various points therein as illustrated in FIG. 9. The input waveform of FIG. 9A causes the one-shot 161 to emit an output as shown in FIG. 9B. This output is a pulse having a width "A" each time the input signal of FIG. 9A crosses through zero in a positive going direction. It is the width "A" of the output pulse, which is controlled by the resistance and capacitive time constant circuits within the one-shot 161, that sets the basic width of the pulse output in the line 173. So long as the frequency of the input signal of FIG. 9A is higher than a certain threshold, the output of the one-shot 161 remains high. But when that frequency falls below a level wherein the input signal period is less than "A" then the output of the one-shot 161 drops to zero and this causes the capacitor 165 to discharge. The voltage across the capacitor 165 is shown in FIG. 9C. As the input birdie signal of FIG. 9A in the line 159 crosses through its zero frequency point, the capacitor 165 begins to charge again and when the birdie signal frequency increases above the threshold of the one-shot 161, the capacitor then remains at its full charge voltage. Each of the one-shot multivibrators 161 in each of the shapers 125, 139, 141 and 143 of FIG. 7 is chosen to have a different RC time constant in proportion to the desired different widths of their respective pulse outputs as shown in the magnified pulses of FIG. 6.

The comparator 167 of FIG. 8 receives at one input the voltage across the capacitor 165 as shown in FIG. 9C. It also receives at another input a constant voltage level 177 in the line 157 that is developed from the common pulse width control 155. Whenever the voltage across the capacitor 165 exceeds that voltage 177, the output 169 of the comparator (shown in FIG. 9D) causes the Schmidt trigger 163 to be inhibited and no outout occurs in the line 171. Thus, referring again to FIG. 9, the example there illustrated shows that the Schmidt trigger 163 is permitted to operate between the times 179 and 181 but is inhibited at all other times. Thus, this inhibit signal determines the width of the pulse output of each individual shaper circuit.

The inhibiting circuitry, particularly the one-shot multivibrator 161, operates in the nature of a digital filter. By setting the individual RC time constants of the one-shots of the various shaper circuits, the bandpass of this digital filter is adjusted. In the particular example being described, the one-shot 161 element of the 100 MHz marker shaper 125 is set to have a 500 kHz bandwidth on either side of the zero beat frequency. The one-shot of the 25 MHz marker shaper 139 is set to have a bandwidth of 375 kHz on either side of the zero beat frequency. Similarly, the one-shot of the 5 MHz marker pulse shaper 141 is set to have a plus or minus 250 kHz bandwidth. The one-shot of the 1 MHz marker pulse shaper 143 is set to have a bandwidth of plus or minus 125 kHz. These different bandwidths, resulting in different periods of time that the Schmidt trigger is uninhibited, controls the relative widths of the output pulses to permit the stacking as shown and previously described with respect to FIG. 6.

The output of the Schmidt trigger 163 of FIG. 8 in a line 171 is shown in FIG. 9E. It is to be noted that the output occurs only between the times shown by the lines 179 and 181 of FIG. 9. The output is a series of pulses, the pulse rise being triggered by the input birdie signal of FIG. 9A in the line 159 of FIG. 8 moving positively through some positive threshold. Similarly, the pulse is terminated when the birdie signal moves negatively through some negative threshold voltage. This is then applied to the integrator circuit 175 whose output in a line 173 is shown in FIG. 9F. The integrator concentrates the output pulse energy near the center of the pulse and also maintains a uniform amplitude of the pulse for its duration. This is more clearly shown in a FIG. 9G which is the integrator output pulse shown in a smaller scale. The pulse outputs of each of the shaper circuits are direct current marks which makes them amplitude stackable wherein the alternating current birdie signals from which they are developed are not so stackable.

Although the various aspects of the present invention have been described with respect to a specific example and their preferred embodiments, it will be understood that the aspects of the invention are entitled to protection within the full scope of the appended claims.

What is claimed is:

1. A system for measuring the level of a desired signal over a frequency range of interest that appears in a circuit under test of a given impedance along with undesirable interferring noise within a frequency range exclusive of said signal frequency range, comprising:
    an input signal port having first and second sides,
    a finite input termination impedance connected between said first and second sides of said input port, whereby voltages corresponding to said desired signal and said undesirable interferring noise are developed across said impedance,
    a first reactance element connected to said first side of said port, and a second reactance element connected to said second side of said port, each reactance element characterized by having a lower impedance to said signal frequency range of interest than to said interferring noise, and
    means operably connected to said first and second input port sides in series with said reactance elements for indicating the value of said signal of interest across said input impedance, whereby the reactance elements isolate said indicating means from any interferring noise voltage across said input impedance.

2. The system according to claim 1, wherein said first input port side is connected to ground potential, and further wherein said indicating means includes a high gain amplifier having two input terminals operably connected to said first and second input port sides in series with said reactance elements, one input terminal of said amplifier being connected to ground potential with no additional ground potential connection occurring in the circuits that extend between said reactances and the input terminals of the amplifier.

3. The system according to claim 2, wherein said first reactance is of a value that its impedance within the undesirable interferring signal range is at least many times higher than any impedance in the connection of said first input port side to ground potential.

4. The system according to claim 3, wherein said input termination impedance is of a value substantially the same as said given impedance of said circuit under test.

5. The system according to claim 4, wherein said indicating means has an impedance thereacross at its connection to said reactances that is at least several times the value of said input termination impedance within the signal range.

6. The system according to claim 5, wherein said signal frequency range lies within the radio frequency portion of the spectrum the said noise frequency range is within an interval between direct current and 1000 Hz.

7. The system according to claim 2, wherein said amplifier is characterized by a logarithmic transfer function, whereby said indicating means may express the value of the signal of interest in decibels.

8. The system according to claim 2, wherein said indicating means additionally includes a broadband detector operably connected to said first and second port sides in series with said reactance elements in a manner that its rectified output is operably connected to said amplifier input terminals.

9. The system according to claim 1, wherein said input termination impedance is of a value substantially the same as said given impedance of said circuit under test.

10. The system according to claim 9, wherein said input termination impedance is a resistance of a value substantially equal to 50 or 75 ohms.

11. The system according to claim 1, which additionally comprises:
a swept frequency signal generator for connection to the circuit under test that is characterized by emitting a signal at an output that repetitively scans from a first frequency substantially linearly to a second frequency in a first period and with a return interval in a second period wherein the signal output returns from the second frequency to the first frequency, and first and second frequencies defining said frequency range of interest,
said indicating means comprising:
a broadband detector circuit operably connected to said first and second port sides in series with said reactance elements, thereby to produce a slowly varying output voltage having a magnitude at any instant that is proportional to the magnitude of the desired signal at said input port, and
a high gain direct current amplifier receiving at an input the low frequency voltage output of said detector circuit, and
means responsive to said signal generator for adjusting an input bias level to said amplifier during each second period in a manner to correct for any amplifier drift over time.

12. The system according to claim 11, wherein said bias adjusting means additionally includes means for switching said amplifier input from connection with the output of said detector to connection with a dummy load during said second interval, whereby said amplifier is disconnected during that interval from the input signal source.

13. The system according to claim 11, wherein said signal generator output is turned off during said second interval.

14. The system according to claim 1, which additionally comprises:
a swept frequency signal generator for connection to the circuit under test that is characterized by emitting a signal at an output that repetitively scans from a first frequency substantially linearly to a second frequency in a first period and with a return interval in a second period wherein the signal output returns from the second frequency to the first frequency, said first and second frequencies defining said frequency range of interest,
said indicating means comprising:
a broadband detector circuit operably connected to said first and second port sides in series with said reactance elements, thereby to produce a slowly varying output voltage having a magnitude proportional to the magnitude of the desired signal at said input port, said detector additionally characterized by a non-flat transfer characteristic between said first and second frequencies, and
means receiving a signal from said signal generator that is proportional in magnitude at any instance to its frequency output for combining said signal to an output of said detector prior to indication, whereby the non-flat transfer characteristic of said detector is compensated.

15. The system according to claim 14, wherein said indicating means additionally comprises an amplifier having a logarithmic transfer function and connected to receive the detector output signal and amplify it before combining the detector output with the signal generator frequency proportional signal.

16. A system for measuring the level of a desired signal within a radio frequency band of interest from a circuit of a given impedance that also includes interfering noise within a frequency range less than 1000 Hz, comprising:
first and second input terminals, said first terminal being connected directly to a chassis ground,
an input impedance connected between said first and second input terminals and having a value substantially equal to said circuit given impedance,
a first capacitance having one side connected to said first terminal,
a second capacitance having one side connected to said second terminal,
each of said first and second capacitances being of a value to have a small reactance to the radio frequency band of interest when compared to their reactance at the noise frequency range, said first capacitance additionally being of a value to have a large reactance within the noise frequency range relative to any impedance in that range of the connection between the first terminal and chassis ground,
opposite sides of each of the first and second capacitors being connected to a detector circuit, said detector circuit having first and second output terminals across which a slowly varying voltage is developed that is proportional to the magnitude of said desired signal at said input terminals,
a high gain direct current amplifier having first and second input terminals operably connected to said first and second output terminals of the detector, respectively, said first amplifier input terminal being connected to chassis ground with no additional chassis ground connections occurring between the opposite sides of said capacitances and said amplifier input terminals, and
means receiving an output of said amplifier for indicating the value of the signal of interest across said first and second terminals.

17. A method of testing a circuit device, comprising the steps of:
applying to said circuit device a time varying frequency signal that substantially progresses in a first time interval from a first frequency to a second frequency and then in a second time interval returns from the second frequency to begin again at said first frequency,
receiving from the circuit device a return signal and applying it to a termination impedance, thereby developing across said impedance a signal waveform that includes said test signal after modification by the circuit device, said waveform additionally including undesirable interferring noise within a frequency range outside of a range between said first and second frequencies, applying the signal across said termination impedance to two reactances on either side thereof, each reactance element characterized by a lower impedance to said signal frequency range of interest than to said noise frequency range, connecting outputs of said reactances to a broadband detector, thereby to develop a slowly varying voltage signal, applying the detected signal to two input terminals of a high gain direct current amplifier, thereby developing a direct current output signal, maintaining one input terminal of said high gain amplifier connected to ground potential, no other part of the circuit between the outputs of the reactances and the input to said amplifier being connected to ground potential, and applying the output signal of said amplifier to an indicator, whereby the value of said signal within said signal generator frequency range appearing across said input termination impedance is indicated.

18. The method according to claim 17 and comprising the additional step of adjusting the level of a bias to said amplifier during each of said second time intervals to correct for any amplifier drift.

19. The method according to claim 17, and comprising the additional step of adding to the output signal of the amplifier before application to the indicator a signal proportional at any instant to the frequency of the signal being applied to the circuit device, whereby non-linear frequency response characteristics of said broadband detector are compensated.

20. The method according to claim 19, wherein the step of applying the detected signal to the amplifier comprises applying that signal to an amplifier having a logarithmic transfer characteristic.

21. A system for testing a circuit device comprising:
a swept frequency signal generator for connection to said circuit device that is characterized by emitting a signal at an output that repetitively scans from a first frequency substantially linearly to a second frequency in a first period and with a return interval in a second period, wherein the signal output returns from the second frequency to the first frequency, means receiving a return signal from the circuit device for detecting said return signal, means including a direct current amplifier connected to an output of said detecting means for amplifying a signal therefrom, and means responsive to said signal generator for adjusting a bias to said amplifier during each second period of the signal generator cycle in a manner to correct for any drift of the amplifier.

22. The system according to claim 21, wherein said signal generator is further characterized by emitting no signal to the device under test during each second period, whereby said amplifier drift is corrected in the absence of any signal being applied to the circuit device.

23. The system according to claim 21, wherein said adjusting means additionally includes means for disconnecting said amplifier input from said detecting means during each second period of the signal generator and connecting it instead to a passive detector circuit that is unconnected with the circuit device return signal, whereby said amplifier drift is corrected in the absence of any return signal from the circuit device.

24. A system for measuring characteristics of a circuit device, comprising:
a swept frequency signal generator for connection to said circuit device that is characterized by emitting a signal at an output that repetitively scans from a first frequency substantially linearly to a second frequency in a first period and with a return interval in a second period, wherein the signal output returns from the second frequency to the first frequency, means receiving a return signal from the circuit device for detecting the return signal, said detector being characterized by a broadband, non-flat response over the frequency range between said first and second frequencies of said signal generator, means receiving the output of said detecting means and responsive to said signal generator for combining with said detector output a signal voltage that is directly proportional at any instant to the frequency output of said signal generator, whereby the non-flat characteristics of the detector are compensated, and means receiving the output of said combining means for indicating the level of said circuit device return signal.

25. The system according to claim 24 which additionally comprises a logarithmic amplifier connected between said detector and said combining means.

26. An electrical testing system, comprising:
an instrument case,
a swept frequency signal generator within said case and characterized by emitting a signal that repetitively scans from a first frequency substantially linearly to a second frequency in a first period and with a return interval in a second period wherein the signal output returns from the second frequency to the first frequency, a cathode ray tube display device within said case and having two orthogonal deflection signal inputs, one of said inputs being operatively connected to said signal generator to receive a voltage proportional to its frequency, whereby scanning in one direction repetitively occurs alternately with a retrace in another direction, a return loss measuring circuit within said case, comprising:
a first connector for operably connecting to an input of a device under test,
directional means receiving the signal generator output for passing that signal to said first connector in a manner that any portion of the signal returned by the device appears at an input independent of the signal generator output,
a detector circuit having an input and an output, said input being operably connected to said directional means output, said detector circuit being capable of responding to the entire spectrum between said first and second frequencies at one time,
a high gain direct current amplifier having an input operably connected to said detector output, and
signal processing means connected between an output of said amplifier and a second of said orthogonal driving inputs of the cathode ray tube display device for displaying the amplitude of a signal presented at said directional means input, and a transmission loss measuring circuit within said case, comprising:

a second connector for operably connecting to an output of a device under test, a detector circuit having an input and an output, said detector input being operably connected to said second connector, said detector circuit being capable of responding to the entire spectrum between said first and second frequencies at one time, a high gain direct current amplifier having an input operably connected to said detector output, and signal processing means connected between an output of said amplifier and said second of said orthogonal driving inputs of the cathode ray tube display device for displaying the amplitude of a signal presented at said second connector.

27. The testing system according to claim 26, wherein said input and output of each detector, the input of each amplifier, said directional means input and said signal input connector are all two terminal devices, said system connected across each of the directional means input and the input connector terminals, a reactance element connected in series between each of the directional means input terminals and one of the return loss detector input terminals, and a reactance element connected in series between each of the input connector terminals and one of the transmission loss detector input terminals, whereby said reactances may be sized to have a much lower impedance in a range between said first and second signal generator frequencies than in an exclusive frequency range of interferring noise, thereby to suppress the noise.

28. The testing system according to claim 27, wherein one of the directional means input terminals is connected to ground potential, and one of the input connector terminals is connected to ground potential, and further wherein one of the input terminals of each amplifier is connected to ground by a path independent of circuits between the reactances and the amplifier input.

29. The testing system according to claim 28, wherein said first and second frequencies of the signal generator lie in the radio frequency portion of the spectrum, and further wherein each of the reactances include a series connected capacitance, the value of the capacitances being such that they have a reactance between said first and second signal generator frequencies that is many times less than the reactances at frequencies below 1000 Hz, whereby noise below 1000 Hz is significantly attenuated.

30. The measuring system according to claim 26, which additionally comprises:

means as part of said signal generator for developing a signal proportional in amplitude to the frequency output of said signal generator, and means as part of said signal processing means in each of the return loss measuring circuit and the transmission loss measuring circuit for combining said signal generator output proportional signal with the signal output of their associated amplifier, whereby non-linear characteristics of their associated detector as a function of frequency may be corrected.

31. The measuring system according to claim 30, wherein the amplifier in the signal processing means in each of the return loss measuring circuit and the transmission loss circuit is characterized by a logarithmic transfer function.

32. The measuring system according to claim 26, which additionally comprises within said case means responsive to said signal generator for adjusting a bias to each of said amplifiers during each second period of the signal generator cycle in a manner to correct for any drift of the amplifier.

33. The system according to claim 32, wherein said signal generator is further characterized by emitting no signal to the device under test during each second period, whereby said amplifier drift is corrected in the absence of any signal being applied to the circuit device.

34. The system according to claim 32, wherein said adjusting means additionally includes means for disconnecting each of said amplifier inputs from said detecting means during each second period of the signal generator and connecting it instead to a passive circuit with substantially the same impedance characteristics as said detector means and that is unconnected with the circuit device return signal, whereby said amplifier drift is corrected in the absence of any return signal from the circuit device.

35. The measuring system according to claim 26, which additionally comprises within said case:

means responsive to said signal generator for developing frequency marking signals at definite spaced intervals, and means as part of said signal processing means for combining said frequency marking signals with the signal from the detectors, whereby the signal presented at said input terminals is displayed on the cathode ray tube with periodic frequency markers superimposed thereon for ease in determining the frequency value of any point on the display.

36. The measuring system according to claim 35, wherein said marker signal developing means comprises first means for generating a plurality of frequency markers at one frequency interval, second means for generating frequency markers at a multiple of said one frequency interval, and means for combining the output of said first and second frequency interval marker generating means in a manner to produce a string of markers having varying height depending upon their interval.

37. The measuring system according to claim 36, wherein each separate frequency marker generating means includes means to control the width of its associated frequency marker, the width of the first frequency marker generating means output being wider than that of said second frequency marker generating means.

38. The measuring system according to claim 37, wherein the width control means of each of said first and second frequency marker generating means includes means responsive to a common control voltage for adjusting the width in a manner that the proportionality of the width of the marker outputs of said first and second frequency marker generating means remain proportional.

39. In a testing system that includes a swept frequency signal generator adapted to have its output connected to a device under test, a signal processing circuit adapted to receive a signal response from the device under test, a cathode ray tube display device receiving an output of said signal processor to scan a display beam in one direction thereacross according to the signal response from the device under test and to receive the signal generator output to scan the display beam in the other direction thereacross according to the signal generator frequency, a system for superimposing frequency markers on the cathode ray tube display in said one direction, comprising:

means receiving said signal generator output for developing periodic marking signals in at least two outputs at various frequency intervals of the signal generator output, the periodic marking signals at one output occurring at frequency intervals that are a whole integral multiple of the periodic marking signals generated at the other input,     means receiving the periodic marking signal from said one output for emitting a uniform amplitude pulse of a first duration coincident with the occurrence of each marking signal,     means receiving the periodic marking signal from said other output for emitting a uniform amplitude pulse of a second duration coincident with the occurrence of each marking signal, said second duration being significantly less than said first given duration, and     means receiving the pulses of said emitting means for summing their amplitudes, thereby to apply the sum to said signal processing circuits in a manner that the marking signals are superimposed in the signal displayed on the cathode ray tube.

40. The testing system according to claim 39, which additionally comprises means operably connected to each of said pulse emitting means for controlling each of said first and second pulse durations in proportional amounts, thereby to provide for composite marker width adjustment without changing the proportional shape of the marks.

41. The testing system according to claim 39, wherein said periodic marking signal developing means includes means mixing said signal generator signal with a fixed frequency oscillator output rich in harmonics, thereby generating periodic direct current beat frequency signals that are each bounded by increasing frequency on either side thereof, and wherein each of said pulse emitting means comprises in separate circuits:

a one-shot multivibrator receiving said mixer output and having an internal time constant set to cause an output voltage to drop in a narrow band on either side of the zero beat frequency of said mixer output, said bandwidth of the of the one shot of said first pulse emitting means being set to have a wider bandwidth that the one shot of the second pulse emitting means,     a Schmidt trigger receiving said mixer output, the output of said one shot being connected to said Schmidt trigger in a manner to inhibit the output of the Schmidt trigger at all times except during the time that said one shot output is dropping to zero, and     an integrating circuit receiving the Schmidt trigger output for generating a direct current pulse having a uniform amplitude and its intensity concentrated in its center.

* * * * *

UNITED STATES PATENT OFFICE
CERTIFICATE OF CORRECTION

Patent No. 4,085,361          Dated April 18, 1978

Inventor(s) Robert Bathiany, et al.

It is certified that error appears in the above-identified patent and that said Letters Patent are hereby corrected as shown below:

IN THE ABSTRACT:

Second column, line 19, "cathod" should be --cathode--.

Column 1, line 32, "transversing" should be --traversing--.

Column 1, line 45, before "convert" insert --to--.

Column 2, line 47, "detector" should be --generator--.

Column 4, line 40, after "result" change "of" to --is--.

Column 10, line 64, "upper" should be --larger--.

Column 13, line 32, "outout" should be --output--.

Signed and Sealed this

Thirteenth Day of February 1979

[SEAL]

Attest:

RUTH C. MASON
*Attesting Officer*

DONALD W. BANNER
*Commissioner of Patents and Trademarks*